United States Patent
Omori et al.

(10) Patent No.: US 10,559,722 B2
(45) Date of Patent: Feb. 11, 2020

(54) LIGHT-EMITTING DEVICE

(71) Applicants: Citizen Electronics Co., Ltd., Fujiyoshida-shi, Yamanashi (JP); Citizen Watch Co., Ltd., Nishitokyo-shi, Tokyo (JP)

(72) Inventors: Yuji Omori, Yamanashi (JP); Sadato Imai, Yamanashi (JP); Koki Hirasawa, Yamanashi (JP)

(73) Assignees: CITIZEN ELECTRONICS CO., LTD., Fujiyoshida-Shi, Yamanashi (JP); CITIZEN WATCH CO., LTD., Nishitokyo-Shi, Tokyo (JP)

( * ) Notice: Subject to any disclaimer, the term of this patent is extended or adjusted under 35 U.S.C. 154(b) by 0 days.

(21) Appl. No.: 16/095,920

(22) PCT Filed: Apr. 25, 2017

(86) PCT No.: PCT/JP2017/016432
§ 371 (c)(1),
(2) Date: Oct. 23, 2018

(87) PCT Pub. No.: WO2017/188278
PCT Pub. Date: Nov. 2, 2017

(65) Prior Publication Data
US 2019/0140144 A1    May 9, 2019

(30) Foreign Application Priority Data
Apr. 26, 2016    (JP) .................................. 2016-088474

(51) Int. Cl.
*H01L 33/48* (2010.01)
*H01L 25/075* (2006.01)
(Continued)

(52) U.S. Cl.
CPC ........ *H01L 33/486* (2013.01); *H01L 25/0753* (2013.01); *H01L 33/48* (2013.01);
(Continued)

(58) Field of Classification Search
CPC .............................. H01L 33/54; H01L 33/56
See application file for complete search history.

(56) References Cited

U.S. PATENT DOCUMENTS

| 7,081,644 | B2 * | 7/2006 | Flaherty ................. H01L 33/58 257/100 |
| 9,299,895 | B1 | 3/2016 | Hsing Chen et al. |

(Continued)

FOREIGN PATENT DOCUMENTS

| EP | 2975655 A1 | 1/2016 | |
| JP | H10-261821 | * 9/1998 | ............. H01L 33/00 |

(Continued)

OTHER PUBLICATIONS

Machine translation, Inokuchi, Japanese Pat. Pub. No. JP 2008-226928, translation date: Sep. 17, 2019, Espacenet, all pages. (Year: 2019).*

(Continued)

*Primary Examiner* — Victoria K. Hall
(74) *Attorney, Agent, or Firm* — Procopio, Cory, Hargreaves & Savitch LLP

(57) ABSTRACT

Provided is a light-emitting device of which a resin frame serving as a dam of a sealing resin is not readily deformed. The light-emitting device includes: a planar lead frame configured from first and second metal portions which are spaced apart from each other with an insulating resin interposed therebetween; light-emitting elements mounted on the first metal portion and electrically connected by wires to the first and second metal portions; a first resin frame disposed on the lead frame so as to enclose the light-emitting ele-
(Continued)

ments; a sealing resin containing a phosphor for converting the wavelength of light emitted from the light-emitting elements, the sealing resin being filled into a region on the lead frame enclosed by the first resin frame to seal the light-emitting elements; and a second resin frame being harder than the first resin frame and covering an outer surface of the first resin frame at an outer edge of the lead frame.

3 Claims, 9 Drawing Sheets

(51) Int. Cl.
*H01L 33/50* (2010.01)
*H01L 33/56* (2010.01)
*H01L 33/58* (2010.01)
*H01L 33/60* (2010.01)
*H01L 33/62* (2010.01)

(52) U.S. Cl.
CPC ............ *H01L 33/502* (2013.01); *H01L 33/56* (2013.01); *H01L 33/58* (2013.01); *H01L 33/60* (2013.01); *H01L 33/62* (2013.01); *H01L 2224/48091* (2013.01); *H01L 2224/48137* (2013.01); *H01L 2924/181* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | | | |
|---|---|---|---|---|
| 10,361,344 | B2* | 7/2019 | Fukasawa | F21V 31/04 |
| 2001/0042865 | A1 | 11/2001 | Oshio et al. | |
| 2006/0270792 | A1* | 11/2006 | Kashiwagi | C08L 83/04 |
| | | | | 524/862 |
| 2008/0031009 | A1* | 2/2008 | Kodaira | H01L 33/58 |
| | | | | 362/612 |
| 2008/0048200 | A1* | 2/2008 | Mueller | B29C 41/14 |
| | | | | 257/98 |
| 2009/0166657 | A1 | 7/2009 | Yamada et al. | |
| 2010/0140648 | A1* | 6/2010 | Harada | H01L 33/60 |
| | | | | 257/98 |
| 2011/0291154 | A1 | 12/2011 | Noichi et al. | |
| 2013/0134467 | A1* | 5/2013 | Ooyabu | F21V 21/00 |
| | | | | 257/98 |
| 2014/0084259 | A1* | 3/2014 | Kim | H01L 51/5237 |
| | | | | 257/40 |
| 2014/0233239 | A1* | 8/2014 | Matsuda | F21V 1/16 |
| | | | | 362/294 |
| 2014/0291716 | A1* | 10/2014 | Ukawa | H01L 33/505 |
| | | | | 257/98 |
| 2015/0016107 | A1* | 1/2015 | Wimmer | H01L 33/60 |
| | | | | 362/235 |
| 2015/0092414 | A1 | 4/2015 | Okura | |
| 2017/0023830 | A1* | 1/2017 | Yang | G02F 1/133617 |
| 2017/0222106 | A1* | 8/2017 | Nakabayashi | H01L 33/502 |

FOREIGN PATENT DOCUMENTS

| | | | | |
|---|---|---|---|---|
| JP | H10-261821 A | | 9/1998 | |
| JP | 2006-147851 | * | 6/2006 | ............ H01L 33/00 |
| JP | 2006-147851 A | | 6/2006 | |
| JP | 2008-226928 | * | 9/2008 | ............ H01L 33/00 |
| JP | 2008-226928 A | | 9/2008 | |
| JP | 2009-164157 | * | 7/2009 | ............ H01L 33/00 |
| JP | 2009-164157 A | | 7/2009 | |
| JP | 2010-186814 A | | 8/2010 | |
| JP | 2010-206039 | * | 9/2010 | ............ H01L 33/48 |
| JP | 2010-206039 A | | 9/2010 | |
| JP | 2010-219324 A | | 9/2010 | |
| JP | 2014-209602 A | | 11/2014 | |
| JP | 2015-038939 A | | 2/2015 | |
| JP | 2015-070134 A | | 4/2015 | |
| JP | 2015-201608 A | | 11/2015 | |

OTHER PUBLICATIONS

Machine translation, Yamada, Japanese Pat. Pub. No. JP 2009-164157, translation date: Sep. 17, 2019, Espacenet, all pages. (Year: 2019).*

Machine translation, Oshio, Japanese Pat. Pub. No. JP H10-261821, translation date: Sep. 17, 2019, Espacenet, all pages. Year: 2019).*

Machine translation, Igarashi, Japanese Pat. Pub. No. JP 2010-206039, translation date: Sep. 17, 2019, Espacenet, all pages. (Year: 2019).*

Machine translation, Kato, Japanese Pat. Pub. No. JP 2006-147851, translation date: Sep. 17, 2019, Espacenet, all pages. (Year: 2019).*

Written Opinion of the International Search Authority, WIPO, dated Jul. 11, 2017, all pages. (Year: 2017).*

International Search Report and Written Opinion for related International Application No. PCT/JP2017/016432, dated Jul. 11, 2017; English translation provided; 14 pages.

Extended European Search Report for related EP App No. 177895604 dated Nov. 26, 2019, 8 pgs.

* cited by examiner (A)

(B)

(A)

(B)

LIGHT-EMITTING DEVICE

CROSS-REFERENCE TO RELATED APPLICATIONS

This application is a U.S. National Stage entry of PCT Application No: PCT/JP2017/016432 filed Apr. 25, 2017, which claims priority to Japanese Patent Application No. 2016-088474, filed Apr. 26, 2016, the contents of which are incorporated herein by reference.

FIELD

The present invention relates to a light-emitting device.

BACKGROUND

Chip-On-Board (COB) light-emitting devices are known in which light-emitting elements, such as light-emitting diode (LED) elements, are mounted on a conventional substrate, such as a ceramic or metal board. In such light-emitting devices, the LED elements are sealed with a phosphor-containing translucent or transparent resin; and light emitted from the LED elements is mixed with light generated by exciting the phosphor with the emitted light, thereby producing light of a desired color, such as white, according to the purpose.

For example, Patent Literature 1 describes a light-emitting device including a board having conductive patterns thereon, light-emitting elements mounted on the board, a light reflective resin disposed around the light-emitting elements to reflect light therefrom, and conductive wires which are at least partially embedded in the light reflective resin and electrically connect the conductive patterns and the light-emitting elements.

Some of such light-emitting devices include a sealing body which is formed from a light transmissive resin into a convex-lens shape and disposed above a light-emitting element, so that this lens condenses light emitted from the light-emitting element, thereby increasing luminance (for example, see Patent Literature 2 to 4).

For example, Patent Literature 2 describes a light-emitting device including a planar lead frame having first and second leads, a light-emitting element placed on the first lead, a resin frame enclosing the light-emitting element, a first sealing resin filled into the resin frame to seal the light-emitting element, and a second sealing resin covering the resin frame and the first sealing resin. In this light-emitting device, the lower end of the inner surface of the resin frame is placed only on the first lead; the second sealing resin covers at least part of first and second leads outside the resin frame; and of the rear surface of the first lead, a region immediately below the light-emitting element is exposed.

CITATIONS LIST

Patent Literature

Patent Literature 1: Japanese Unexamined Patent Publication No. 2009-164157
Patent Literature 2: Japanese Unexamined Patent Publication No. 2014-209602
Patent Literature 3: Japanese Unexamined Patent Publication No. 2010-186814
Patent Literature 4: Japanese Unexamined Patent Publication No. 10-261821

SUMMARY

In order to realize a light-emitting device which can be used as a point source of light, it is necessary to narrow a light-emitting region as much as possible and mount multiple light-emitting elements at high density. In this case, since a resin frame serving as a dam of a sealing resin sealing the light-emitting elements is disposed very near to the light-emitting elements, wires electrically connecting the light-emitting elements are partially embedded in the resin frame. Since the resin frame is formed from a relatively soft resin in order to prevent deformation and breaks of the wires, it is not resistant to a mounting load applied for mounting the light-emitting device on a substrate. Accordingly, pressing the resin frame may deform or break the embedded wires.

It is an object of the present invention to provide a light-emitting device of which a resin frame serving as a dam of a sealing resin is not readily deformed.

Provided is a light-emitting device including: a planar lead frame configured from first and second metal portions which are spaced apart from each other with an insulating resin interposed therebetween; light-emitting elements mounted on the first metal portion and electrically connected by wires to the first and second metal portions; a first resin frame disposed on the lead frame so as to enclose the light-emitting elements; a sealing resin containing a phosphor for converting the wavelength of light emitted from the light-emitting elements, the sealing resin being filled into a region on the lead frame enclosed by the first resin frame to seal the light-emitting elements; and a second resin frame being harder than the first resin frame and covering an outer surface of the first resin frame at an outer edge of the lead frame.

Preferably, in the above light-emitting device, the first resin frame has a Shore A hardness of 30 to 50, and the second resin frame has a Shore D hardness of 30 to 90.

Preferably, in the above light-emitting device, the first resin frame is disposed so that a portion thereof immediately above the insulating resin straddles the first and second metal portions.

According to the above light-emitting device, the resin frame serving as the dam of the sealing resin is less likely to be deformed than would be the case if the configuration of the present invention were not employed.

DESCRIPTION OF EMBODIMENTS

Hereinafter, with reference to the accompanying drawings, light-emitting devices will be explained in detail. However, it should be noted that the present invention is not limited to the drawings or the embodiments described below.

Figure 1:
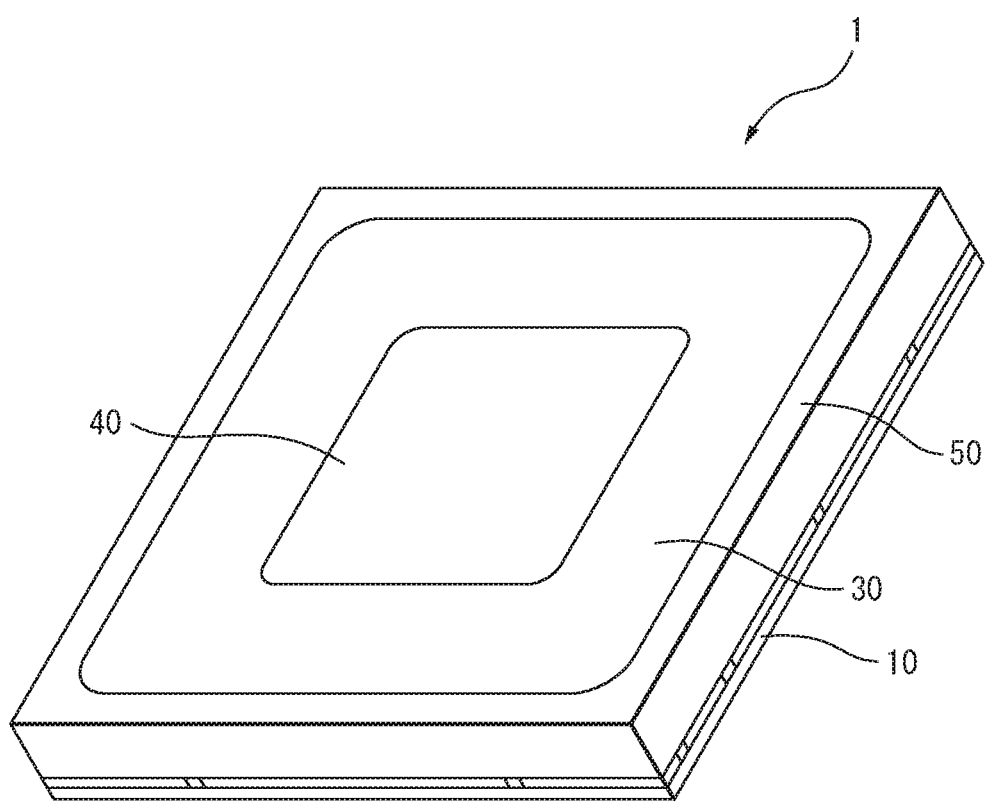
FIG. 1 is a perspective view of a light-emitting device 1.
Figure 2:
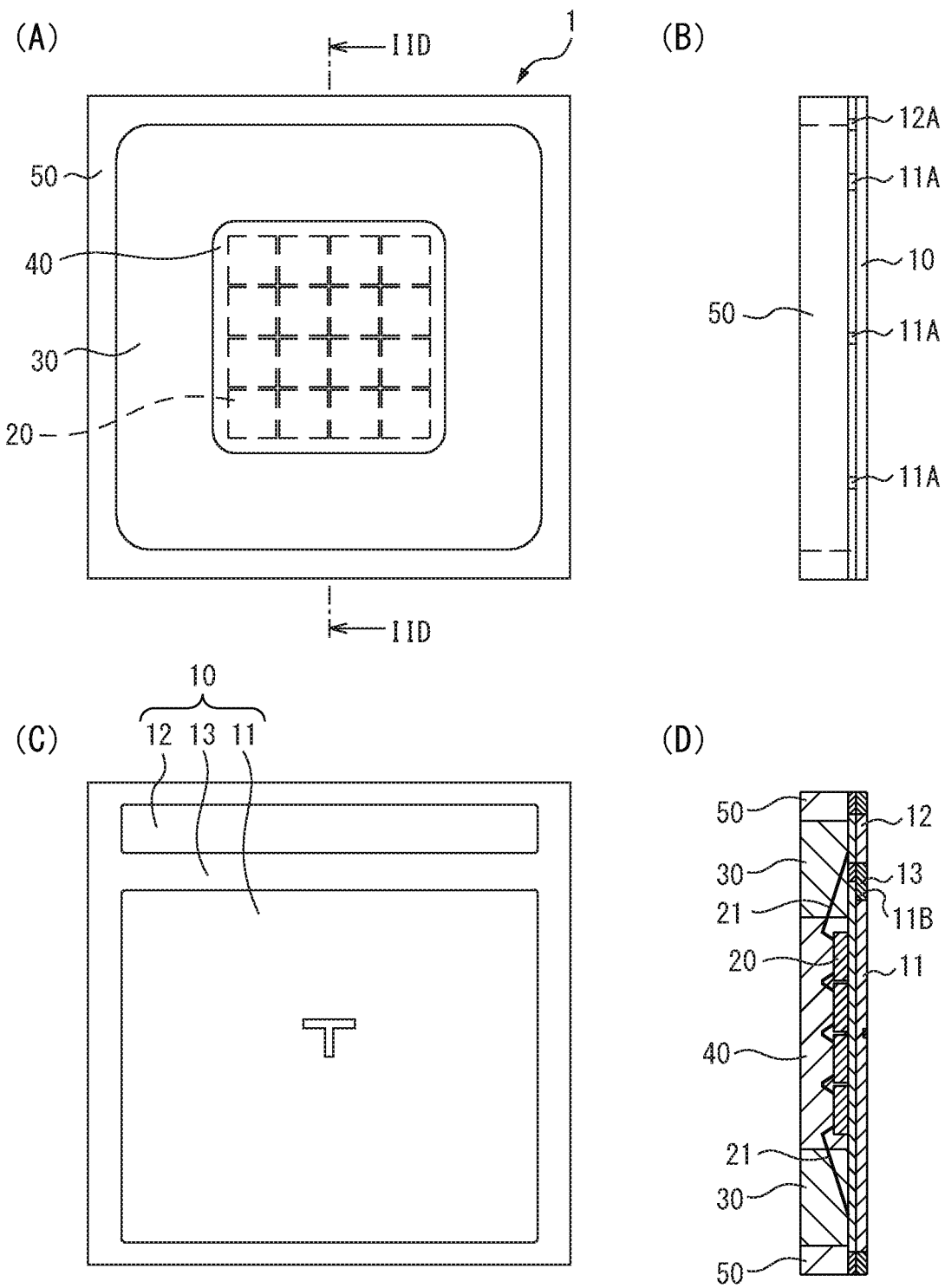
FIGS. 2(A) to 2(D) are a top view, a side view, a bottom view and a cross-sectional view of the light-emitting device 1, respectively.

FIG. 1 is a perspective view of a light-emitting device 1. FIGS. 2(A) to 2(D) are a top view, a side view, a bottom view and a cross-sectional view of the light-emitting device 1, respectively. FIG. 2(D) shows a cross section of the light-emitting device 1 taken along line IID-IID in FIG. 2(A). The light-emitting device 1 is an LED package which includes LED elements as the light-emitting elements and is used as a light source for various kinds of lighting equipment. The light-emitting device 1 includes, as its major components, a lead frame 10, LED elements 20, a dam resin 30, a phosphor-containing resin 40 and an outer resin 50.

Figure 3:
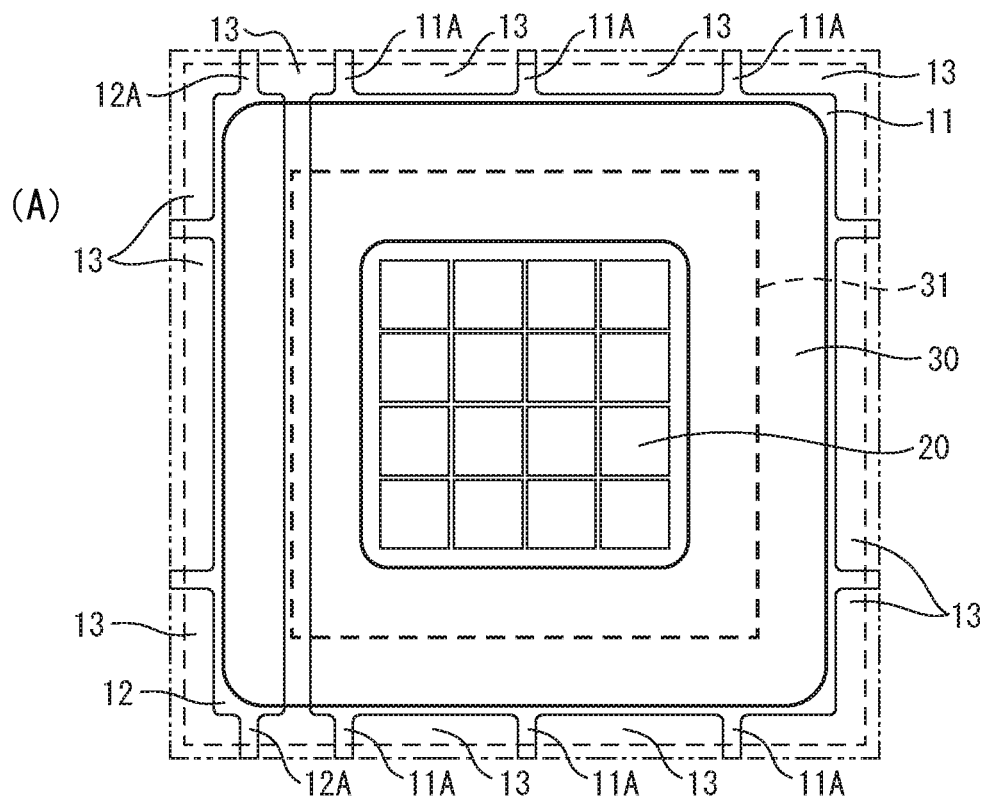
FIGS. 3(A) and 3(B) are a top view and a bottom view showing the positional relationship between the lead frame 10 and the dam resin 30 in the light-emitting device 1, respectively.
Figure 3:
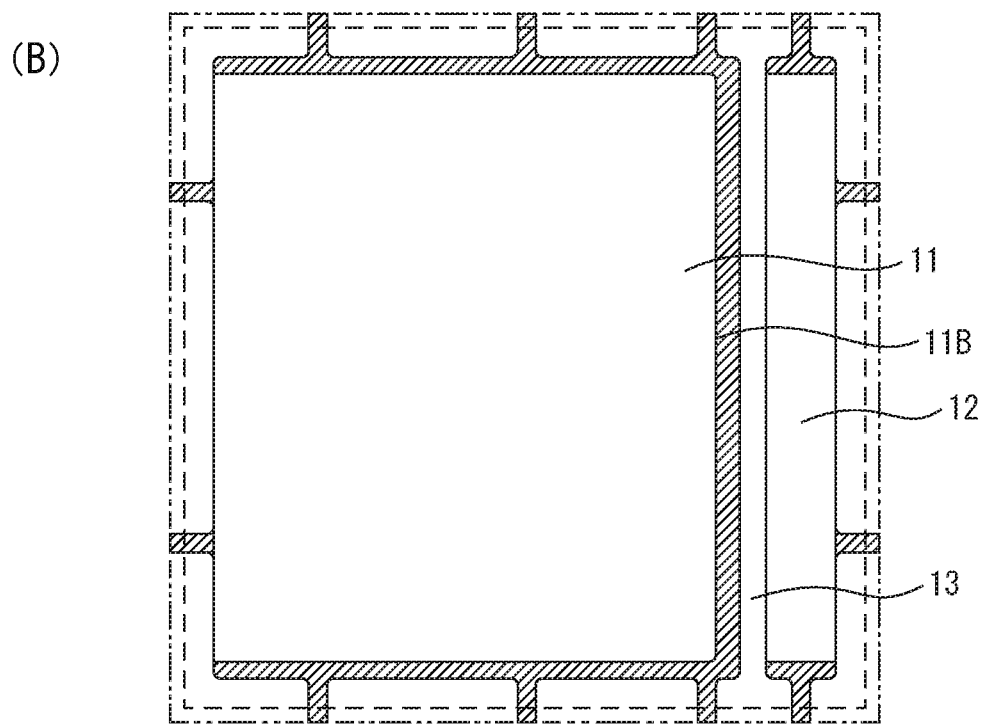

FIGS. 3(A) and 3(B) are a top view and a bottom view showing the positional relationship between the lead frame 10 and the dam resin 30 in the light-emitting device 1, respectively. The lead frame 10 is configured from a first metal portion 11 and a second metal portion 12 which are spaced apart from each other with an insulating resin 13 interposed therebetween, and has a planar shape and a size measuring 6.5 mm square, for example. The lead frame 10 is constructed by cutting a substrate array in which multiple pairs of first and second metal portions 11 and 12 are connected with each other and the insulating resin 13 is interposed therebetween. FIGS. 2(B) and 3(A) show connecting portions 11A and 12A which respectively connect the first and second metal portions 11 and 12 to other first and second metal portions 11 and 12 in the substrate array.

The first and second metal portions 11 and 12 each have a substantially rectangular shape, except for the connecting portions 11A and 12A. As shown in FIGS. 2(C) and 3(A), the first metal portion 11 is larger than the second metal portion 12, and has an upper surface including a mounting region on which the LED elements 20 are mounted. It is preferred that the material of the first and second metal portions 11 and 12 be a metal which excels in heat resistance and heat dissipation, such as copper. The first and second metal portions 11 and 12 function as the cathode and anode electrodes of the light-emitting device 1. Connecting these electrodes to an external power source and applying a voltage thereacross causes the light-emitting device 1 to emit light.

As shown in FIGS. 2(C) and 3(A), the insulating resin 13 is provided in the straight space between the first and second metal portions 11 and 12 and on their outer edges, and electrically insulates the first and second metal portions 11 and 12. A planar component configured from the first metal portion 11, the second metal portion 12 and the insulating resin 13 corresponds to the substrate of the light-emitting device 1. For example, epoxy resin may be used as the insulating resin 13.

As shown in FIG. 3(B), in the lead frame 10, the edge of the bottom of the first metal portion 11 facing the second metal portion 12 is shaven off by half-etching so as to form a step. In FIG. 3(B), the portions on which half-etching is performed are indicated by oblique hatching. As shown in FIG. 2(D), the edge of the first metal portion 11 facing the second metal portion 12 is thus provided with a step 11B, which is also filled with the insulating resin 13. The step 11B is provided due to the following two conflicting reasons: the first and second metal portions 11 and 12 should be separated as much as possible in order to prevent a short circuit therebetween; but the mounting region of the LED elements 20 on the upper surface of the first metal portion 11 should be widened as much as possible.

The LED elements 20 are an example of the light-emitting elements, and made of a gallium nitride compound semiconductor which emits light having a wavelength in the ultraviolet to blue regions, for example. However, the LED elements 20 may be any semiconductor elements which generally referred to as light-emitting diodes; and their material and emission wavelength are not specifically limited. In the light-emitting device 1, as an example, sixteen LED elements 20 are mounted in total in a lattice pattern having four rows and four columns, as shown in FIGS. 2(A) and 3(A). The lower surface of each LED element 20 is bonded to the upper surface of the first metal portion 11 by such means as a transparent and electrically insulating adhesive. Although the arrangement of the LED elements 20 may be different from the illustrated one, they are preferably arranged in a regular-square pattern as shown in the figures, in order to narrow the light-emitting region as much as possible and thereby to realize a point source of light.

Figure 4:
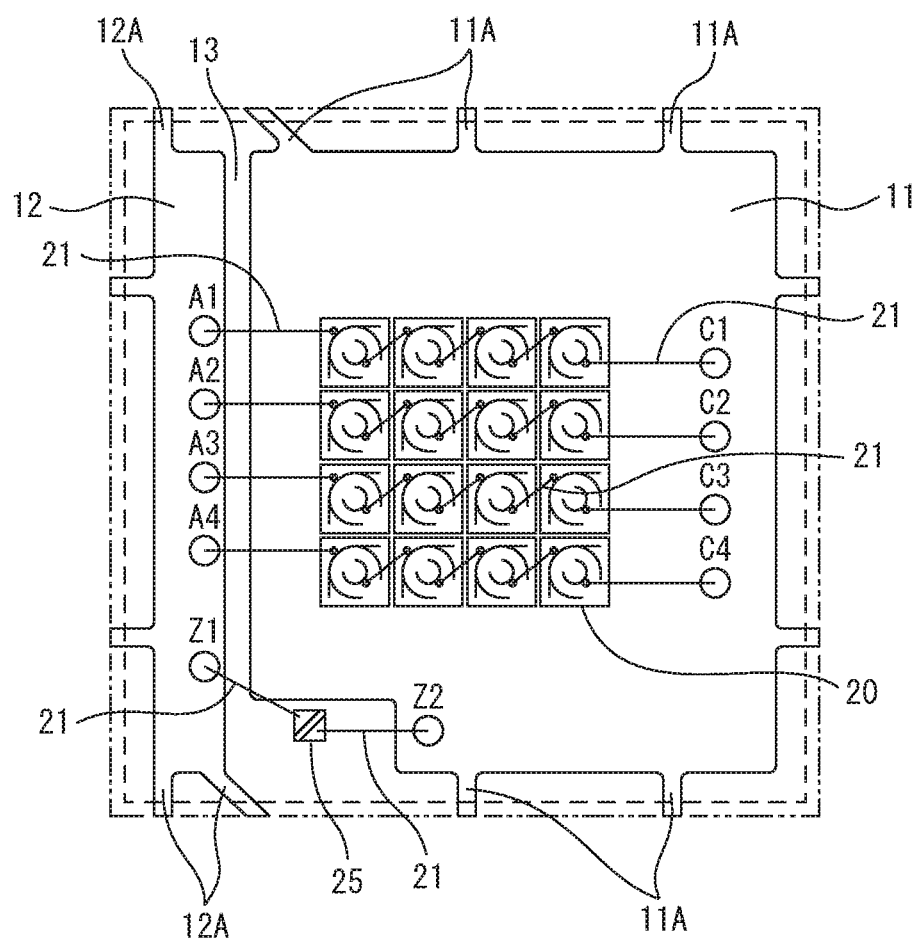
FIG. 4 is a diagram showing the connection relationship between the LED elements 20 in the light-emitting device 1.

FIG. 4 is a diagram showing the connection relationship between the LED elements 20 in the light-emitting device 1. Each LED element 20 has a pair of element electrodes on the upper surface thereof. As shown in FIG. 4, the element electrodes of adjacent LED elements 20 are electrically connected to each other by bonding wires (hereinafter, simply referred to as wires) 21. The material of the wires 21 is gold, for example, but may be another metal, such as silver, copper, platinum or aluminum, or an alloy thereof. In the light-emitting device 1, as an example, the sixteen LED elements 20 are divided into four groups each including four LED elements 20 which are connected in series and aligned in the lateral direction of FIG. 4; and the four groups are connected in parallel to the first and second metal portions 11 and 12.

The wires 21 from the four LED elements 20 placed at the right end in FIG. 4 are respectively connected to four pads C1 to C4 provided on the upper surface of the first metal portion 11. The wires 21 from the four LED elements 20 placed at the left end in FIG. 4 are respectively connected to four pads A1 to A4 provided on the upper surface of the second metal portion 12. Thus, applying a voltage across the first and second metal portions 11 and 12 supplies a current to the LED elements 20 through the wires 21.

As shown in FIG. 4, the light-emitting device 1 further includes a protective element (Zener diode) 25 for protecting the LED elements 20. The protective element 25 is connected to the first and second metal portions 11 and 12 in parallel with the LED elements 20. More specifically, it is connected by wires 21 to a pad Z2 provided on the upper surface of the first metal portion 11 and a pad Z1 provided on the upper surface of the second metal portion 12. Thus, when a voltage is applied to the LED elements 20 in the reverse direction, the protective element 25 causes a current to bypass the LED elements 20 and thereby protects them.

The dam resin 30 is an example of the first resin frame, has a hollow square shape, and is disposed on the lead frame 10 so as to enclose the sixteen LED elements 20. The dam resin 30 is provided for preventing the resin filled as the phosphor-containing resin 40 from flowing out. The dam resin 30 is a white resin having light reflectivity, and thus causes light emitted laterally from the LED elements 20 to reflect toward the upper side of the light-emitting device 1 (the side opposite to the lead frame 10 as seen from the LED elements 20). The dam resin 30 is configured by mixing a reflective material, such as titanium oxide or aluminum oxide, with an epoxy resin or silicone resin, for example.

In the light-emitting device 1, since the inner edges of the dam resin 30 are placed very near to the LED elements 20 in order to narrow the light-emitting region, the pads C1 to C4 and the pads A1 to A4 shown in FIG. 4 are disposed under the dam resin 30. Accordingly, the wires 21 connected to the pads C1 to C4 or the pads A1 to 44 are partially embedded in the dam resin 30.

As shown in FIG. 3(A), in the light-emitting device 1, the center line 31 of a segment of the dam resin 30 extending in parallel with the longitudinal direction of the second metal portion 12 lies on the insulating resin 13. Accordingly, the dam resin 30 is disposed so that a segment (portion) thereof immediately above the insulating resin 13 straddles the first and second metal portions 11 and 12. Unlike the illustrated example, for example, the inner edge of the dam resin 30 may be disposed immediately above the insulating resin 13. However, it is preferred that all of the first metal portion 11, the second metal portion 12 and the insulating resin 13 be disposed immediately below a segment of the dam resin 30, since the insulating resin 13 connecting the first and second metal portions 11 and 12 can be reinforced by the dam resin 30.

The phosphor-containing resin 40 is an example of the sealing resin, and filled into the region on the first metal portion 11 enclosed by the dam resin 30 to integrally cover and protect (seal) all of the sixteen LED elements 20 and the wires 21. In the illustrated example, the phosphor-containing resin 40 has a substantially rectangular and planar shape, and is fixed on the lead frame 10 by the dam resin 30. It is preferred to use a colorless and transparent resin, such as an epoxy resin or silicone resin, in particular, a resin having a heat resistance up to about 250° C., as the phosphor-containing resin 40.

In the phosphor-containing resin 40, a phosphor is dispersed for converting the wavelength of the light emitted from the LED elements 20. For example, if blue LEDs emitting blue light are used as the LED elements 20, it is preferred that the phosphor-containing resin 40 contain a yellow phosphor. The yellow phosphor is a particulate phosphor material, such as yttrium aluminum garnet (YAG), which absorbs the blue light emitted from the LED elements 20 and converts the wavelength thereof into that of yellow light. In this case, the light-emitting device 1 produces white light by combining the blue light emitted from the blue LED elements 20 with the yellow light generated by exciting the yellow phosphor with the blue light.

The phosphor-containing resin 40 may alternatively contain two or more kinds of phosphors. For example, if blue LEDs are used as the LED elements 20, the phosphor-containing resin 40 may contain green and red phosphors. The green phosphor is a particulate phosphor material, such as $(BaSr)_2SiO_4:Eu^{2+}$, which absorbs the blue light emitted from the LED elements 20 and converts the wavelength thereof into that of green light. The red phosphor is a particulate phosphor material, such as $CaAlSiN_3:Eu^{2+}$, which absorbs the blue light emitted from the LED elements 20 and converts the wavelength thereof into that of red light. In this case, the light-emitting device 1 produces white light by combining the blue light emitted from the blue LED elements 20 with the green and red light generated by exciting the green and red phosphors with the blue light.

The outer resin 50 is an example of the second resin frame, and covers the outer surfaces of the dam resin 30 at the outer edges of the lead frame 10. More specifically, the outer resin 50 has a hollow square shape enclosing the dam resin 30, and has inner surfaces adhering closely to the outer surfaces of the dam resin 30. The lateral size of the outer resin 50 is the same as the outer size of the insulating resin 13 provided for the lead frame 10. Thus, the outer surfaces of the outer resin 50 correspond to those of the light-emitting device 1. The height of the outer resin 50 is substantially the same as that of the dam resin 30.

The outer resin 50 is also a white resin having light reflectivity, and is configured by mixing a reflective material, such as titanium oxide or aluminum oxide, with an epoxy resin or silicone resin, for example, similarly to the dam resin 30. Since the light-emitting device 1 includes a small number of, i.e., four-times-four LED elements 20 and a dam resin 30 having a relatively small diameter, the outer resin 50 is provided for the purpose of reinforcing the package. Since the outer resin 50 is disposed closer to the outer edges of the lead frame 10 than the pads C1 to C4 and the pads A1 to A4, the wires 21 are not embedded in the outer resin 50.

It is preferred that the dam resin 30 and the phosphor-containing resin 40 be a relatively soft resin, in order to prevent breaks of the embedded wires 21. However, since the dam resin 30 functions as a frame of the package, it is harder than the phosphor-containing resin 40. More specifically, it is preferred that the dam resin 30 have a Shore A hardness of 30 to 50.

The outer resin 50 is harder than the dam resin 30. In other words, in the light-emitting device 1, the hardness of the phosphor-containing resin 40, the dam resin 30 and the outer resin 50 increases in this order. As described above, since the dam resin 30 is a relatively soft resin, pressing the dam resin 30 at the time of mounting the light-emitting device 1 on a substrate may deform or break the embedded wires 21. However, as for the light-emitting device 1, for example, adsorbing the outer resin 50 at the time of picking up the light-emitting device 1 with a die collet and applying a mounting load onto the outer resin 50 prevents deformation of the dam resin 30, since the outer resin 50 functions as a reinforcement. The outer resin 50 is selected so as to have hardness sufficient to withstand an actual mounting load, and preferably has a Shore D hardness of 30 to 90, for example.

In the light-emitting device 1, the mounting region on the first metal portion 11 inside the dam resin 30 is about 3 mm square in size, while each LED element 20 is about 0.7 mm square in size. Assume that four LED elements twice as large as the LED elements 20 are flip-chip mounted in a rectangular arrangement in the mounting region having the same size as in the light-emitting device 1. In this case, since a conductive connecting material used for mounting on the substrate prohibits the LED elements from being arranged very close to each other, a cross-shaped gap is made at the center of the mounting region. Accordingly, phosphor particles included in the center portion are supplied with a less amount of light from the LED elements, which also decreases the amount of light emitted from the center portion of the package. If the mounted LED elements are chip size packages (CSPs) including a phosphor thereon, the decrease in amount of light is more conspicuous because the phosphor is not arranged at the center portion of the whole package (device).

In contrast, in the light-emitting device 1, since the LED elements 20 are electrically connected to the substrate by the wires 21, the material connecting the LED elements 20 to the substrate may be an insulant, which enables the relatively small LED elements 20 to be closely arranged at a pitch of 0.1 mm or less. This allows for substantially uniform light emission from the whole light-emitting region, without decreasing the amount of light emitted from the center portion thereof.

Figure 5:
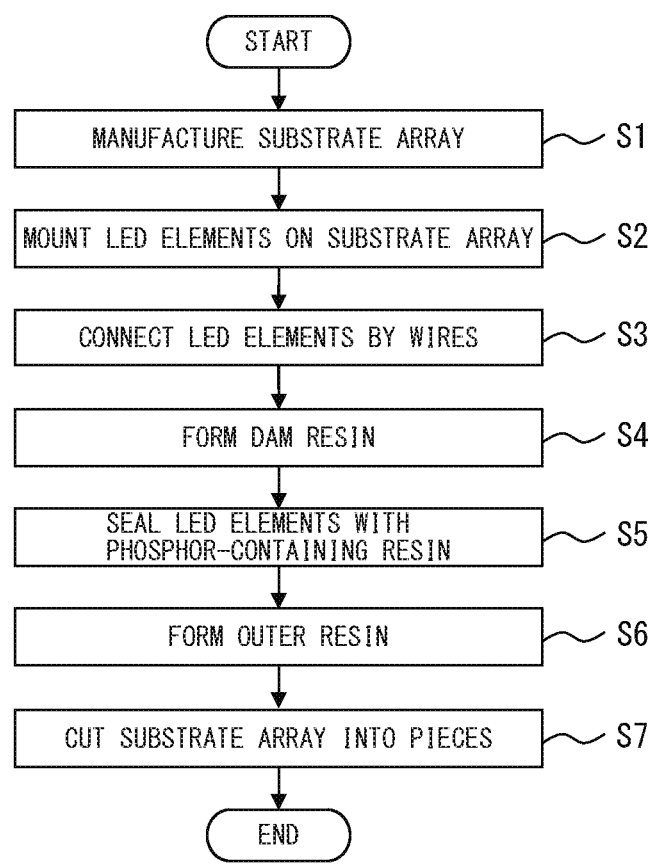
FIG. 5 is a flowchart illustrating a manufacturing process of the light-emitting device 1.

FIG. 5 is a flowchart illustrating a manufacturing process of the light-emitting device 1. In manufacturing the light-emitting device 1, a substrate array in which multiple lead frames 10 are connected to each other is first manufactured (S1). On each lead frame 10 in this substrate array, sixteen LED elements 20 are mounted by die bonding (S2), and electrically connected to each other by wires 21 (S3), as shown in FIG. 4.

Next, on each lead frame 10, a dam resin 30 is formed so as to enclose the LED elements 20 (S4); and a phosphor-containing resin 40 is filled into the mounting region enclosed by the dam resin 30 to seal the LED elements 20 and the wires 21 (S5). Thereafter, on each lead frame 10, an outer resin 50 is formed around the dam resin 30 (S6). It is preferred to first fill the phosphor-containing resin 40 and then form the outer resin 50 as described above, because this makes the lead frame 10 less likely to warp at the time of mounting the LED elements, as compared to the case where the order of formation is reversed. Finally, the substrate array is cut at the connecting portions 11A and 12A of the first and second metal portions 11 and 12, thereby obtaining multiple light-emitting devices 1 (S7). This completes the manufacturing process of the light-emitting device 1.

Figure 6:
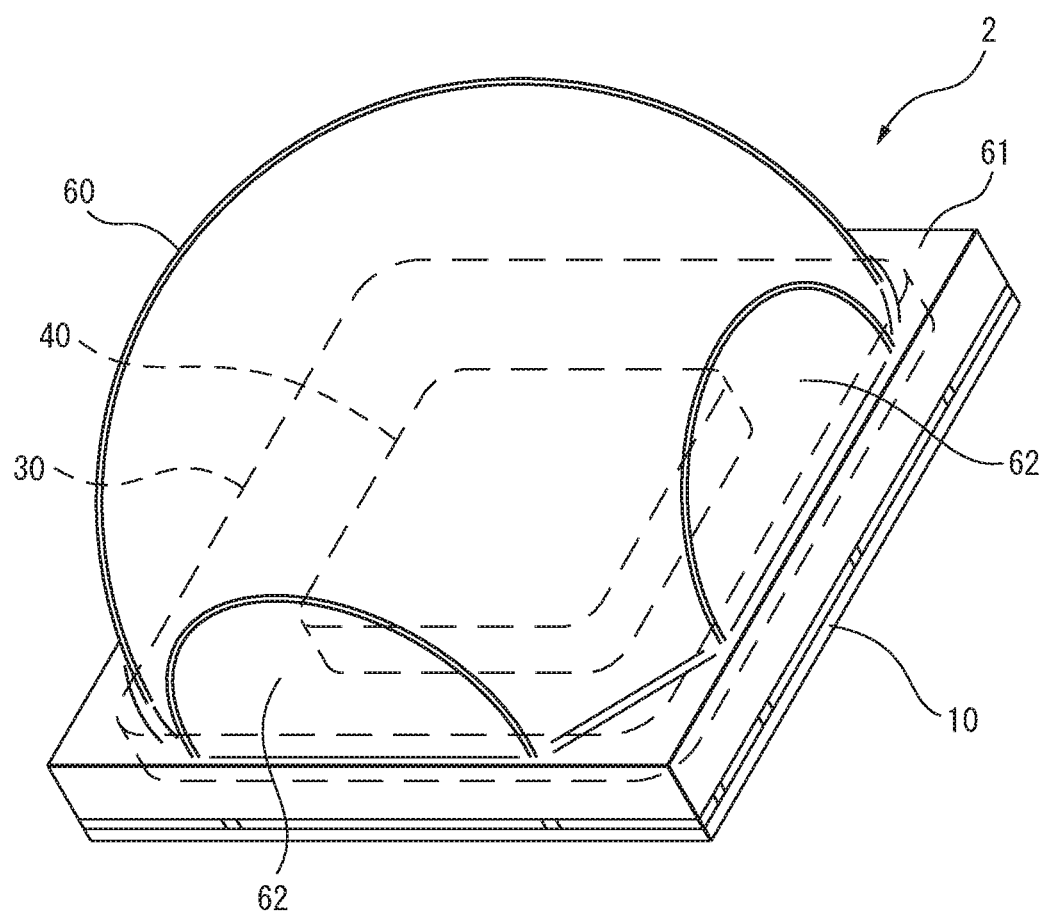
FIG. 6 is a perspective view of a light-emitting device 2.
Figure 7:
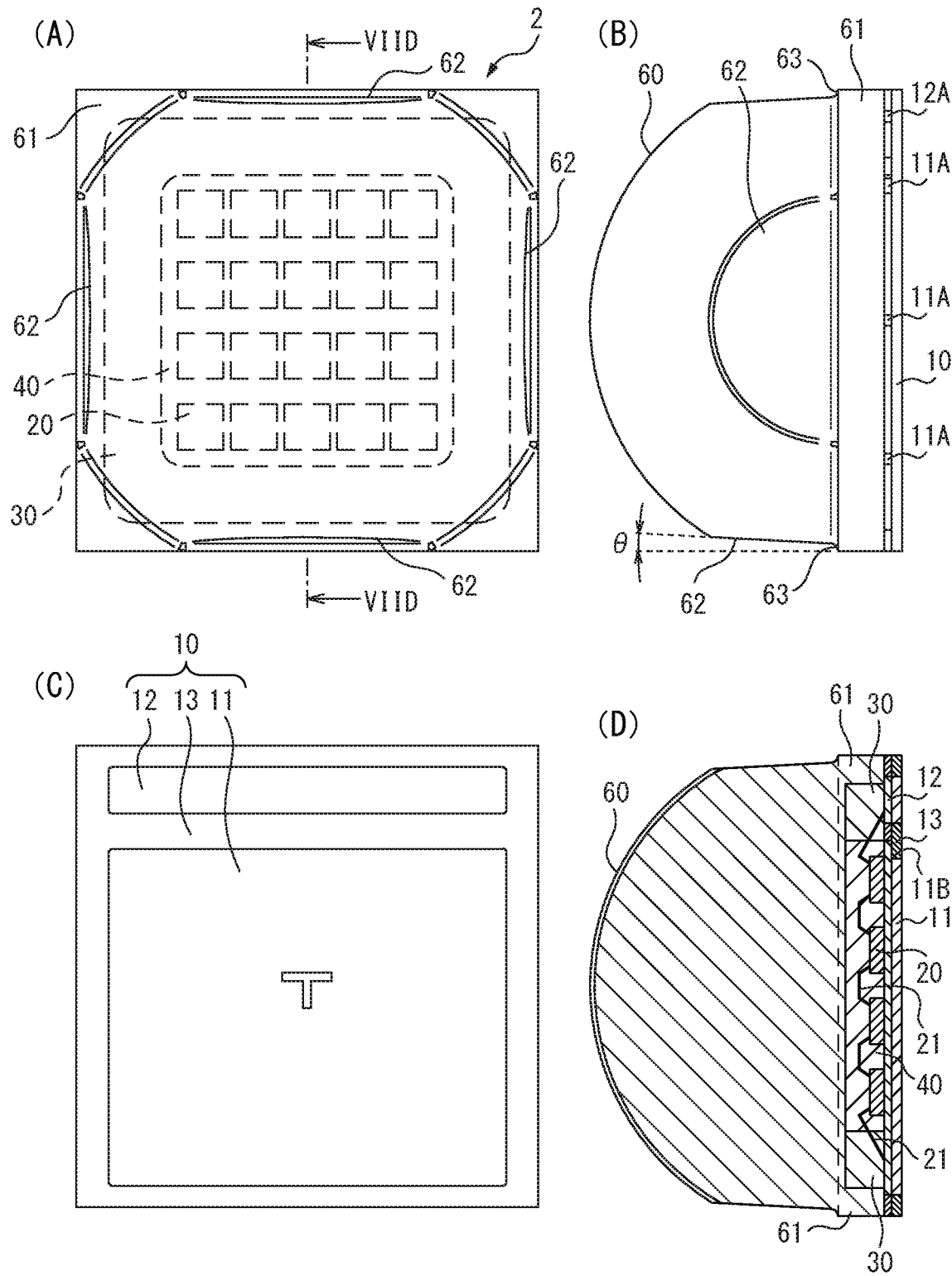
FIGS. 7(A) to 7(D) are a top view, a side view, a bottom view and a cross-sectional view of the light-emitting device 2, respectively.

FIG. 6 is a perspective view of a light-emitting device 2. FIGS. 7(A) to 7(D) are a top view, a side view, a bottom view and a cross-sectional view of the light-emitting device 2, respectively. FIG. 7(D) shows a cross section of the light-emitting device 2 taken along line VIID-VIID in FIG. 7(A).

The light-emitting device 2 includes, as its major components, a lead frame 10, LED elements 20, a dam resin 30, a phosphor-containing resin 40 and a lens resin 60. The light-emitting device 2 is an LED package used for lighting equipment, similarly to the light-emitting device 1, but differs therefrom in that the light-emitting device 2 includes a lens resin 60 instead of the outer resin 50 and includes twenty LED elements 20, i.e., more LED elements than the light-emitting device 1. The light-emitting device 2 will be described below by dealing mainly with the differences from the light-emitting device 1. The same portions as those of the light-emitting device 1 will not be further described herein.

Figure 8:
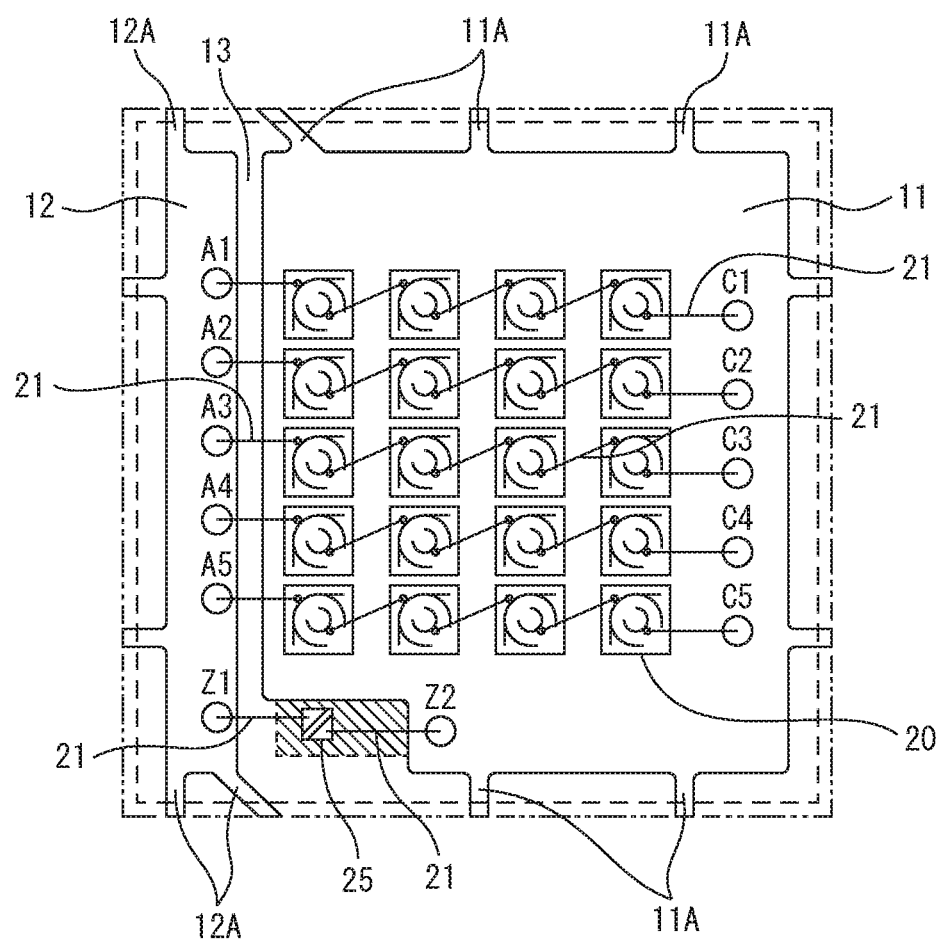
FIG. 8 is a diagram showing the connection relationship between the LED elements 20 in the light-emitting device 2.

FIG. 8 is a diagram showing the connection relationship between the LED elements 20 in the light-emitting device 2. In the light-emitting device 2, twenty LED elements 20 are mounted in total in a lattice (regular-square) pattern having five rows and four columns on the first metal portion 11 of the lead frame 10, as an example, as shown in FIG. 8. The LED elements 20 of the light-emitting device 2 are divided into five groups each including four LED elements 20 which are connected in series and aligned in the lateral direction of FIG. 8; and the five groups are connected in parallel to the first and second metal portions 11 and 12. In this case, it is preferred that the light-emitting region be a regular square, instead of a rectangle, in view of optical properties. Adjusting the space between the LED elements 20 in the lengthwise and bread directions allows the light-emitting region of the package to be a regular square. Further, mounting multiple small LED elements allows for flexibly changing the shape of the light-emitting region.

In the light-emitting device 2, the wires 21 from the five LED elements 20 placed at the right end in FIG. 8 are respectively connected to five pads C1 to C5 provided on the upper surface of the first metal portion 11. The wires 21 from the five LED elements 20 placed at the left end in FIG. 8 are respectively connected to five pads A1 to A5 provided on the upper surface of the second metal portion 12. Thus, applying a voltage across the first and second metal portions 11 and 12 supplies a current to the LED elements 20 through the wires 21. Further, in the light-emitting device 2 also, a protective element 25 is connected by wires 21 pads Z2 and Z1 respectively provided on the upper surfaces of the first and second metal portions 11 and 12.

Figure 9:
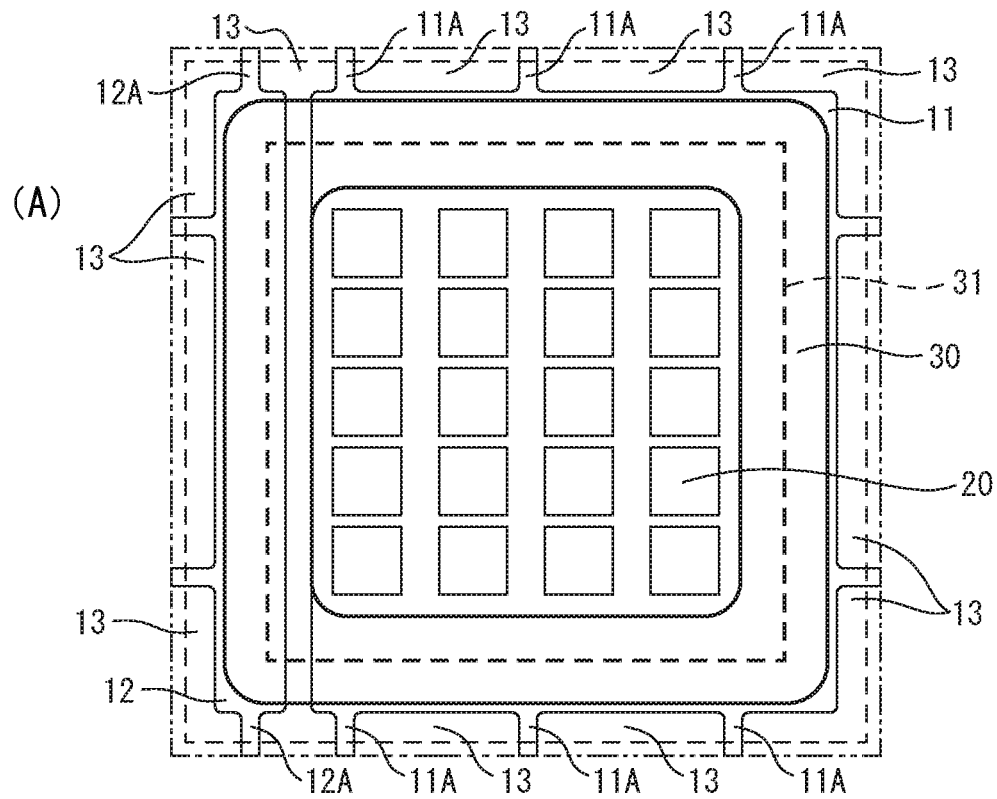
FIGS. 9(A) and 9(B) are a top view and a bottom view showing the positional relationship between the lead frame 10 and the dam resin 30 in the light-emitting device 2, respectively.
Figure 9:
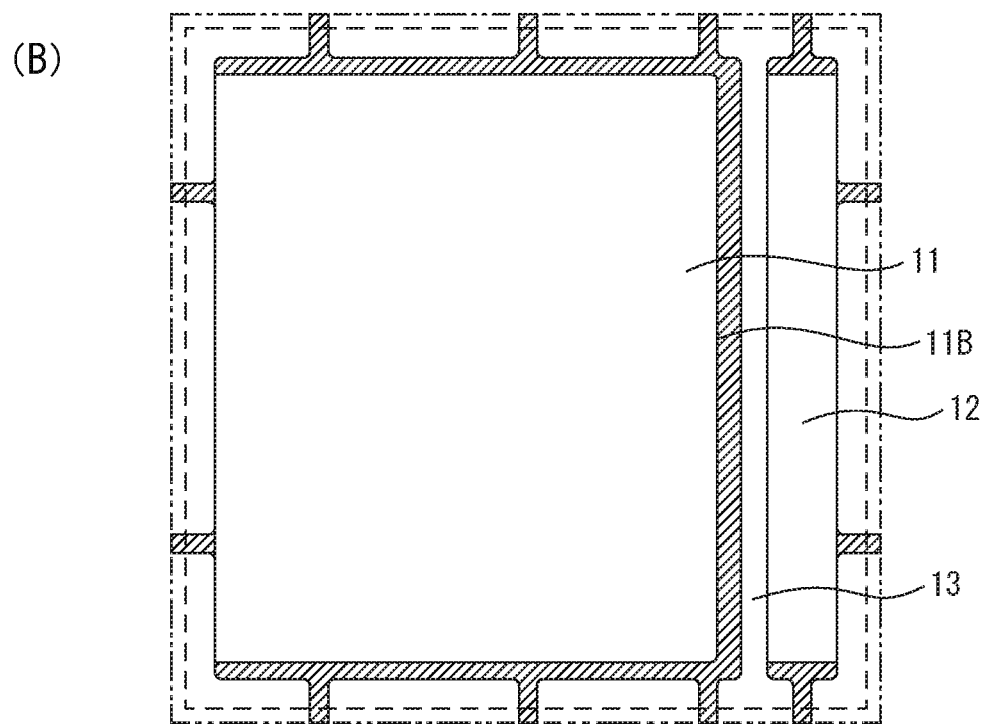

FIGS. 9(A) and 9(B) are a top view and a bottom view showing the positional relationship between the lead frame 10 and the dam resin 30 in the light-emitting device 2, respectively. In the light-emitting device 2 also, the pads C1 to C5 and the pads A1 to A5 shown in FIG. 8 are disposed under the dam resin 30; and the wires 21 connected to these pads are partially embedded in the dam resin 30. However, in the light-emitting device 2, as shown in FIG. 9(A), the center line 31 of a segment of the dam resin 30 extending in parallel with the longitudinal direction of the second metal portion 12 lies on the second metal portion and the inner edge of the dam resin 30 overlaps the boundary between the first metal portion 11 and the insulating resin 13. Accordingly, the segment of the dam resin 30 extending in parallel with the longitudinal direction of the second metal portion 12 is disposed on the second metal portion 12. and the insulating resin 13, without straddling the first and second metal portions 11 and 12.

The lens resin 60 is a substantially hemispherical component disposed on the dam resin 30 and the phosphor-containing resin 40, and is formed from a transparent resin, such as a silicone resin, by injection molding. The lens resin 60 is preferably formed from a material adhering closely to the dam resin 30 and the phosphor-containing resin 40 so that air may not be included therebetween, and is preferably the same resin as the dam resin 30 or the phosphor-containing resin 40.

The lens resin 60 includes an outer portion 61 which is integrally formed with the hemispherical lens portion and covers the outer surfaces of the dam resin 30. In other words, in the light-emitting device 2, the outer portion 61 of the lens resin 60 corresponds to the outer resin 50 of the light-emitting device 1. The lateral size of the outer portion 61 is the same as the outer size of the insulating resin 13 provided for the lead frame 10. Thus, the outer surfaces of the outer portion 61 correspond to those of the light-emitting device 2.

The lens resin 60 is designed so as to minimize a loss caused by inward reflection of light emitted from the LED elements 20 on the surface of the lens resin 60. In other words, the lens resin 60 is designed so as to have a radius of curvature such that the light emitted from the LED elements 20 is perpendicularly incident on the surface of the lens. However, since this radius of curvature makes the lens resin 60 too large as compared to the size of the whole package, the lens resin 60 is provided with four D-cut surfaces 62 in line with the respective sides of the rectangular mounting region of the LED elements 20 enclosed by the dam resin 30.

In order to reduce the loss of reflection on the D-cut surfaces 62, it is preferred that the light is emitted from the LED elements 20 at an angle closer to the right angle than the critical angle. This can be realized by inclining the D-cut surfaces 62 with respect to the vertical plane toward the LED elements 20. The inclination angle θ between the vertical plane and the D-cut surface 62 shown in FIG. 7(B) is three degrees, for example. The inclination angle θ is determined so that the light from the LED elements 20 is incident on the D-cut surfaces 62 at an angle smaller than the critical angle determined by the material of the lens resin 60 and is thereby emitted through the D-cut surfaces 62 outside the lens resin 60. Appropriately selecting the inclination angle θ of the D-cut surfaces 62 and the height of the dam resin 30 decreases the amount of light which is emitted from the LED elements 20 and reflected inwardly on the outer surface of the lens resin 60, thereby allowing the light to be emitted outside the lens resin 60, which improves light extraction efficiency.

The manufacturing process of the light-emitting device 2 is the same as that of the light-emitting device 1, except that the formation of the outer resin 50 in S6 of FIG. 5 is changed to that of the lens resin 60. The lens resin 60 is formed on every light-emitting device 2 in the substrate array at the same time by using a mold which provides the four D-cut surfaces 62.

As shown in FIG. 7(B), the lens resin 60 is provided with steps 63 at portions where the respective D-cut surfaces 62 are in contact with the outer portion 61. The steps 63 are formed at the final step in the manufacturing process of the light-emitting device 2, i.e., at the step of cutting the substrate array into packages (light-emitting devices 2). If the lens resin 60 and the substrate array are cut at the same time, the steps 63 are not formed. However, since this makes the cut areas larger, cutting causes stress on the light-emitting device 2 and may result in a crack. In manufacturing the light-emitting device 2, only the outer portion 61 and portions thereunder are cut, without cutting the D-cut surfaces 62, the outer portion 61 and the connecting portions 11A and 12A of the lead frame 10 at the same time. This makes the cut areas relatively small, and thus reduces the occurrence of a crack. Further, forming the lens resin 60 with a mold has the effect of eliminating the stress on the lens portion caused by cutting and thus preventing degradation of close adhesion between the substrate array and the lens.

The invention claimed is:

1. A light-emitting device comprising:
a planar lead frame configured from first and second metal portions which are spaced apart from each other with an insulating resin interposed therebetween;
light-emitting elements mounted on the first metal portion and electrically connected by wires to the first and second metal portions;
a first resin frame disposed on the lead frame so as to enclose the light-emitting elements;
a sealing resin containing a phosphor for converting a wavelength of light emitted from the light-emitting elements, the sealing resin being filled into a region on the lead frame enclosed by the first resin frame to seal the light-emitting elements; and
a second resin frame being harder than the first resin frame and covering an outer surface of the first resin frame at an outer edge of the lead frame.

2. The light-emitting device according to claim 1, wherein the first resin frame has a Shore A hardness of 30 to 50, and
the second resin frame has a Shore D hardness of 30 to 90.

3. The light-emitting device according to claim 1, wherein the first resin frame is disposed so that a portion thereof immediately above the insulating resin straddles the first and second metal portions.

* * * * *